(12) United States Patent
Nagai et al.

(10) Patent No.: US 7,907,420 B2
(45) Date of Patent: Mar. 15, 2011

(54) BARE CHIP MOUNTED STRUCTURE AND MOUNTING METHOD

(75) Inventors: Koichi Nagai, Kyoto (JP); Minoru Yamamoto, Hyogo (JP); Ken Takano, Osaka (JP); Tatsuo Sasaoka, Osaka (JP); Kazumichi Shimizu, Osaka (JP)

(73) Assignee: PANASONIC Corporation, Osaka (JP)

( * ) Notice: Subject to any disclaimer, the term of this patent is extended or adjusted under 35 U.S.C. 154(b) by 652 days.

(21) Appl. No.: 11/817,991

(22) PCT Filed: Mar. 7, 2006

(86) PCT No.: PCT/JP2006/304309
§ 371 (c)(1),
(2), (4) Date: Nov. 8, 2007

(87) PCT Pub. No.: WO2006/095703
PCT Pub. Date: Sep. 14, 2006

(65) Prior Publication Data
US 2008/0192423 A1    Aug. 14, 2008

(30) Foreign Application Priority Data
Mar. 9, 2005    (JP) .................................. 2005-064780

(51) Int. Cl.
*H05K 1/11*    (2006.01)
(52) U.S. Cl. ........ 361/792; 361/796; 361/790; 361/729; 361/730; 361/735
(58) Field of Classification Search .................. 361/790, 361/792, 796, 802, 809, 728, 729, 730, 735, 361/748, 749, 752, 683, 760, 784; 257/686, 257/E23.603, E21.505; 438/109; 174/250, 254, 255, 260
See application file for complete search history.

(56) References Cited

U.S. PATENT DOCUMENTS

| | | | | |
|---|---|---|---|---|
| 5,295,044 A | * | 3/1994 | Araki et al. | 361/709 |
| 5,334,875 A | * | 8/1994 | Sugano et al. | 257/686 |
| 5,620,782 A | * | 4/1997 | Davis et al. | 428/209 |
| 6,097,607 A | * | 8/2000 | Carroll et al. | 361/752 |
| 2001/0026010 A1 | | 10/2001 | Horiuchi et al. | |
| 2004/0097010 A1 | * | 5/2004 | Haba | 438/109 |

FOREIGN PATENT DOCUMENTS

| | | |
|---|---|---|
| JP | 10-284684 | 10/1998 |
| JP | 11-282995 | 10/1999 |
| JP | 2000-012606 | 1/2000 |
| JP | 2000-068443 | 3/2000 |
| JP | 2001-257309 | 9/2001 |

(Continued)

OTHER PUBLICATIONS

English language Abstract of JP 2001-257309, Sep. 21, 2001.

(Continued)

*Primary Examiner* — Dameon E Levi
*Assistant Examiner* — Hoa C Nguyen
(74) *Attorney, Agent, or Firm* — Greenblum & Bernstein, P.L.C.

(57) ABSTRACT

A plurality of film substrates (2) having a bare chip (1) mounted on one side or both sides are joined into a laminated state by joint portions (3) and are attached to a motherboard (4) through junction by a joint portion (8) at a location off the mounting areas of the bare chips (1), thereby achieving a lower profile, higher lamination, and higher capacity.

5 Claims, 8 Drawing Sheets

FOREIGN PATENT DOCUMENTS

| | | |
|---|---|---|
| JP | 2001-339011 | 12/2001 |
| JP | 2004-158536 | 6/2004 |
| JP | 2004-356138 | 12/2004 |

OTHER PUBLICATIONS

English language Abstract of JP 2001-257309.
English language Abstract of JP 2004-158536.
English language Abstract of JP 2001-339011.
English language Abstract of JP 10-284684.
English language Abstract of JP 2000-068443.
English language Abstract of JP 2004-356138.
English language Abstract of JP 11-282995.
English language Abstract of JP 2000-012606.

* cited by examiner

BARE CHIP MOUNTED STRUCTURE AND MOUNTING METHOD

TECHNICAL FIELD

The present invention relates to a bare chip mounted structure and a mounting method for mounting semiconductor bare chips on a motherboard in a laminated state, being suited for achieving a lower profile and higher lamination.

BACKGROUND ART

As electronic equipment, especially portable electronic equipment such as cellular phones and portable information terminals, is becoming smaller in size and more sophisticated in function rapidly, various types of semiconductor chips are advancing toward smaller sizes, lower profiles, and higher integration. For cellular phones, memory-type portable music players, HDTV video cameras, 3D game consoles, and the like, memories of even higher capacities and smaller sizes and high density packaging of bare chips are demanded. Among known technologies to meet these demands is to mount bare chips in a laminated state at high density in the fields of SIP, MCM, CSP, PC cards, SD cards, and the like (for example patent documents 1 to 4). Patent documents 1 and 2 disclose technologies for joining single-side or double-side mounted rigid substrates to each other with solder balls for lamination, and attaching the same to a motherboard. Patent document 3 discloses a PC card in which a flexible film substrate having bare chips mounted on both sides alternately is folded back 180° at each interval between the mounting areas of the bare chips for lamination, and is attached in a symmetrical mounting mode so as to cover both the surface and backside of a PC card board and built into a PC card case. Patent document 4 discloses a semiconductor apparatus in which a film substrate having bare chips mounted on both sides alternately is folded back 180° at each interval between the mounting areas of the bare chips for lamination, and all the bare chips are wrapped in.

[Patent Document 1] Japanese Patent Laid-Open Publication No. 2000-68443
[Patent Document 2] Japanese Patent Laid-Open Publication No. 2004-356138
[Patent Document 3] Japanese Patent Laid-Open Publication No. Hei 11-282995
[Patent Document 4] Japanese Patent Laid-Open Publication No. 2000-12606

DISCLOSURE OF THE INVENTION

Problems to be Solved by the Invention

By the way, memories such as a mini SD card, having a smaller size and a lower profile as compared to SD cards and the like mentioned previously, are also in widespread use. For example, the size thereof is 21.5 mm×20 mm×1.4 mm. With the downsizing and low-profiling of these SD cards, mini SD cards, and the like, the resin card cases have become thinner and weaker. The card cases are thus susceptible to distortion and bending deformation due to external forces during loading/unloading and other handling.

When bare chips are mounted by using rigid substrates such as disclosed in patent documents 1 and 2, however, the rigid substrates themselves are prone to cracking because of distortion or bending deformation of the card case, and this cracking can reach the bare chips easily. In order to deal with such distortion and the like, silicone is injected into the card case for reinforcement, though expensive. In particular, since rigid substrates have thicknesses as large as around 0.15 mm and are difficult to slim down further, it is impossible to increase the number of bare chips laminated within a limited thickness and it is difficult to increase the number of laminated bare chips for a further increase in capacity.

Now, when bare chips are mounted by using a film substrate having flexibility such as disclosed in patent documents 3 and 4, the thin and flexible film substrate makes it easier to increase the number of laminated bare chips for a higher capacity with a lower profile as compared to rigid substrates, and facilitates dealing with bending and distortion of the card case. Nevertheless, in the mode of mounting, the film substrate having bare chips mounted thereon is folded back 180° repeatedly at between the mounting areas of the bare chips. Thus, the smaller the intervals of lamination are, the smaller the curvatures of the folded portions become with a drop in the bending strength of the film and the wiring. As a result, the wiring material of the film substrate might be limited to copper, or the film substrate itself and the laminated state might be precluded from achieving an even lower profile and higher lamination.

The present invention has been achieved in view of the foregoing problems, and it is thus an object thereof to provide a bare chip mounted structure and a mounting method capable of achieving an even lower profile and higher lamination.

Means for Solving the Problems

To achieve the foregoing object, a bare chip mounted structure according to the present invention comprises a plurality of film substrates having a bare chip mounted on one side or both sides, the film substrates being joined into a laminated state and attached to a motherboard at a location off areas where their bare chips are mounted on.

In such a configuration, the plurality of film substrates having a bare chip mounted on one side or both sides are put into a laminated state by means of mutual junction without being folded back 180°. This requires no particular bending strength of either films or wiring of the film substrates, increases the freedom of choice of the wiring material, and makes it possible to use film substrates thinner than heretofore. In addition, since the location of the junction is off the mounting areas of the bare chips on the film substrates and will not impair the flexibility of the film substrates around the bare chips, it is possible to prevent external forces from reaching the bare chips through the film substrates even if the case undergoes distortion or bending. This consequently realizes the mounted structure having a laminate of bare chips with an even lower profile, higher lamination, and higher capacity.

Another bare chip mounted structure of the present invention comprises a plurality of film substrates having a bare chip mounted on one side or both sides, the film substrates being joined into a laminated state and attached to a motherboard at one side off areas where their bare chips are mounted on.

In such a configuration, the film substrates are only joined at one side with the others kept free. In addition to the foregoing case, this further facilitates preventing external forces from reaching the bare chips through the film substrates due to distortion or bending of the case, and further improves the durability, contributing to a lower profile and higher lamination.

Yet another bare chip mounted structure of the present invention comprises film-substrates having a bare chip mounted on one side or both sides, the film substrates being joined into a laminated state and attached to a motherboard at part of one side off areas where their bare chips are mounted on.

In such a configuration, the film substrates are joined at part of one side alone, with the others kept free. In addition to the foregoing cases, this further improves the degrees of freedom of the film substrates and the degrees of freedom to bending between the film substrates, as well as the degrees of freedom to distortion between the film substrates, when compared to the case of the 180° folded structure. It facilitates preventing external forces from reaching the bare chips through film substrates due to distortion or bending of the case, contributing to a lower profile and higher lamination.

Now, yet another bare chip mounted structure of the present invention comprises a plurality of film substrates having bare chips mounted on one side or both sides in an axisymmetric arrangement, the film substrates being joined into a laminated state and attached to a motherboard on the axis of symmetry between areas where their bare chips are mounted on.

In such a configuration, the foregoing various types of joint structures can be applied to multi-mounted film substrates having a plurality of bare chips mounted thereon, so that the number of junction points of the film substrates with respect to the number of bare chips laminated is reduced to one out of the number of bare chips multi-mounted. This further increases the degrees of freedom of the film substrates, and further improves the safety of the bare chips from bending and distortion of the case, contributing to a lower profile and higher lamination.

Here, in another configuration, the junction on the axis of symmetry is effected to form a recess in the film substrates from the counter side of the motherboard, and this recess makes a receptacle for a reinforcing rib formed on an inner surface of a case which accommodates the motherboard accompanied with the film substrates. Since the recess in the film substrates from the counter side of the motherboard, formed by joining the plurality of multi-mounted film substrates having bare chips mounted thereon in an axisymmetric arrangement, is used as the receptacle for the reinforcing rib formed on the inner surface of the case which accommodates the motherboard accompanied with the film substrates, it is possible to provide reinforcement that covers the case center which tends to lack in strength, with no particular increase in thickness.

Moreover, in another configuration, joint portions of the film substrates also function as a spacer between the film substrates. This provides, without folding, the film substrates with clearances intended for contact prevention and insulation for situations where the bare chips are opposed to each other between the film substrates, and further improves the degrees of freedom of the film substrates, contributing to a lower profile and higher lamination.

In another configuration, the motherboard to which the film substrates joined in a laminated state is attached is built into a case, and a cushioning material is sealed therein. If there is any room for small clearances between the units of lamination of the film substrates having bare chips mounted thereon, the sealed cushioning material can penetrate in to achieve contact prevention and insulation therebetween. This penetration is easier when the cushioning material is liquid and low in viscosity.

Now, the foregoing bare chip mounted structure can be obtained by a bare chip mounting method comprising the steps of: mounting a bare chip on either one side or both sides of film substrates; joining the plurality of film substrates having the bare chips mounted thereon into a laminated state at a location off areas where the bare chips are mounted on; and attaching the film substrates joined in the laminated state to a motherboard.

Moreover the foregoing bare chip mounted structure can also be obtained by a bare chip mounting method comprising the steps of: mounting a plurality of bare chips on either one side or both sides of film substrates in a symmetric arrangement; joining the plurality of film substrates having the bare chips mounted thereon into a laminated state at the position of a symmetric border between areas where the bare chips are mounted on; and attaching the film substrates joined in the laminated state to a motherboard.

Other features and operations of the present invention will become apparent from the following detailed description and the contents of the drawings. The individual features of the present invention may be used by themselves or in various combinations as far as possible.

BEST MODE FOR CARRYING OUT THE INVENTION

For the purpose of understanding of the present invention, the bare chip mounted structure and a mounting method according to an embodiment of the present invention will be described below in detail with reference to the drawings. It should be noted that the following embodiment is a concrete example of the present invention, and is not intended to limit the technical scope of the present invention.

Figure 1A:
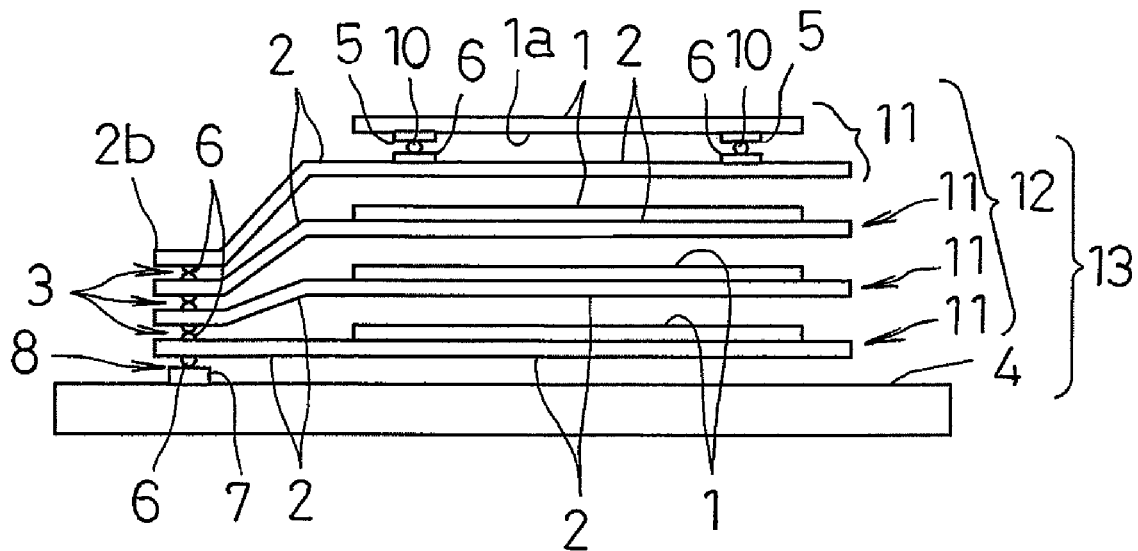
FIGS. 1A and 1B show one example of a bare chip according to an embodiment of the present invention, FIG. 1A being a side view of a mounted structure, FIG. 1B being an enlarged view of a laminated joint portion.
Figure 1B:
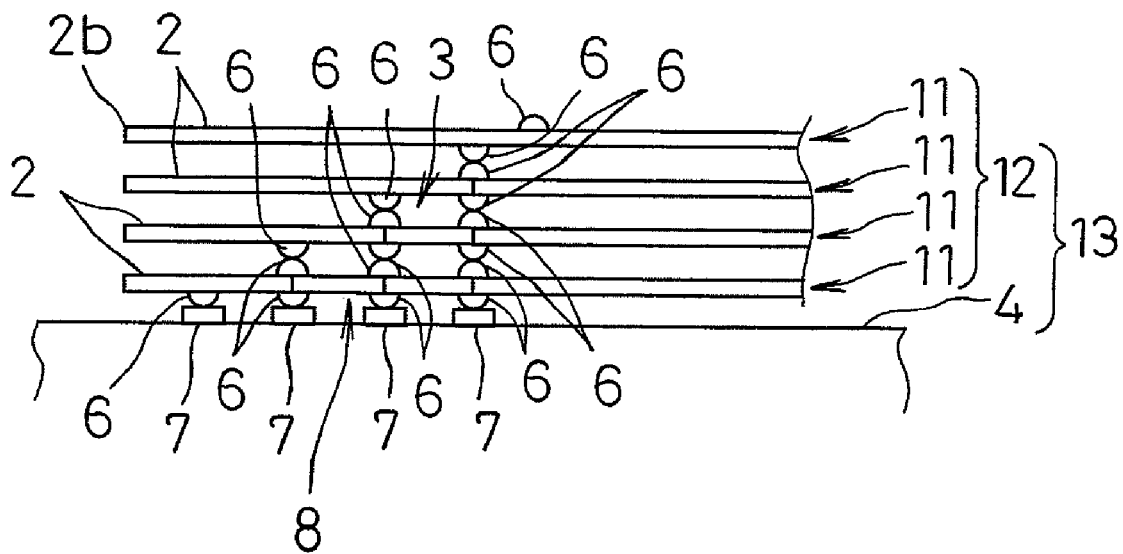
Figure 2:
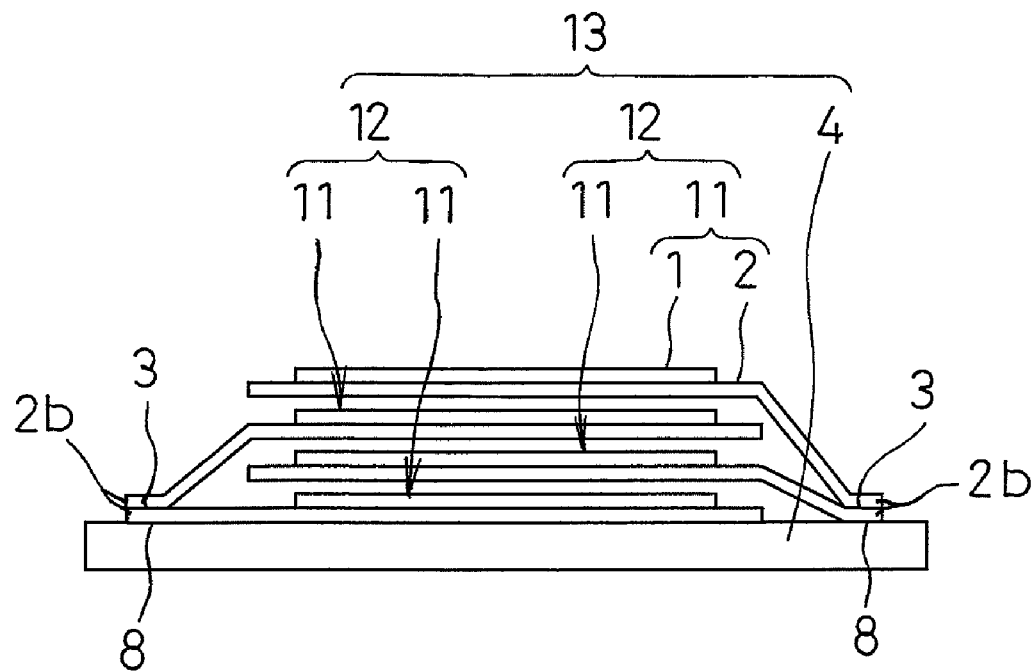
FIG. 2 is a side view of a mounted structure, showing another example of the bare chip according to the embodiment of the present invention.
Figure 3:
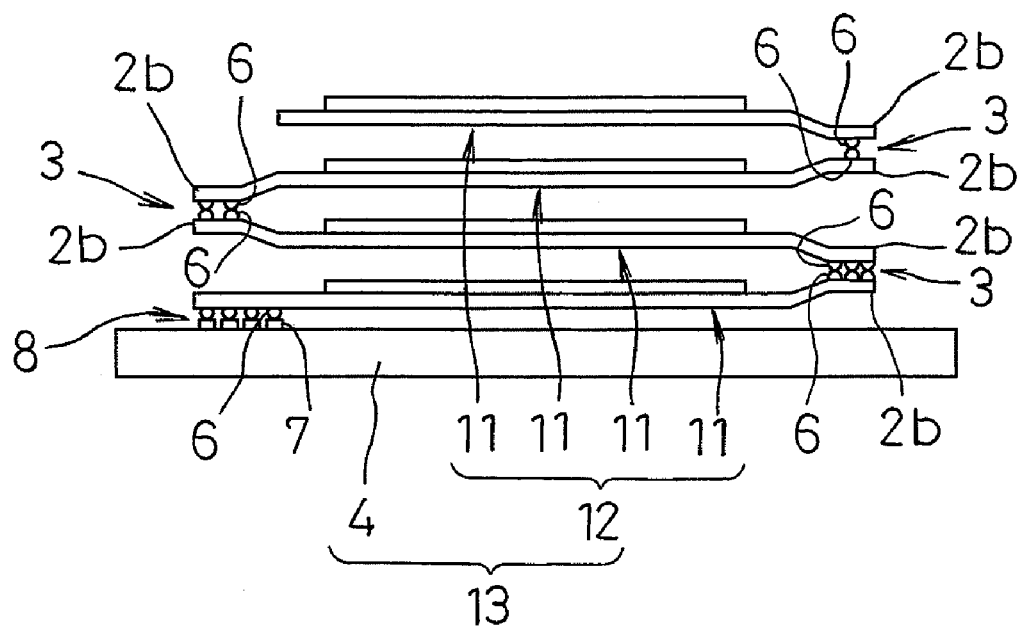
FIG. 3 is a side view of a mounted structure, showing yet another example of the bare chip according to the embodiment of the present invention.
Figure 4:
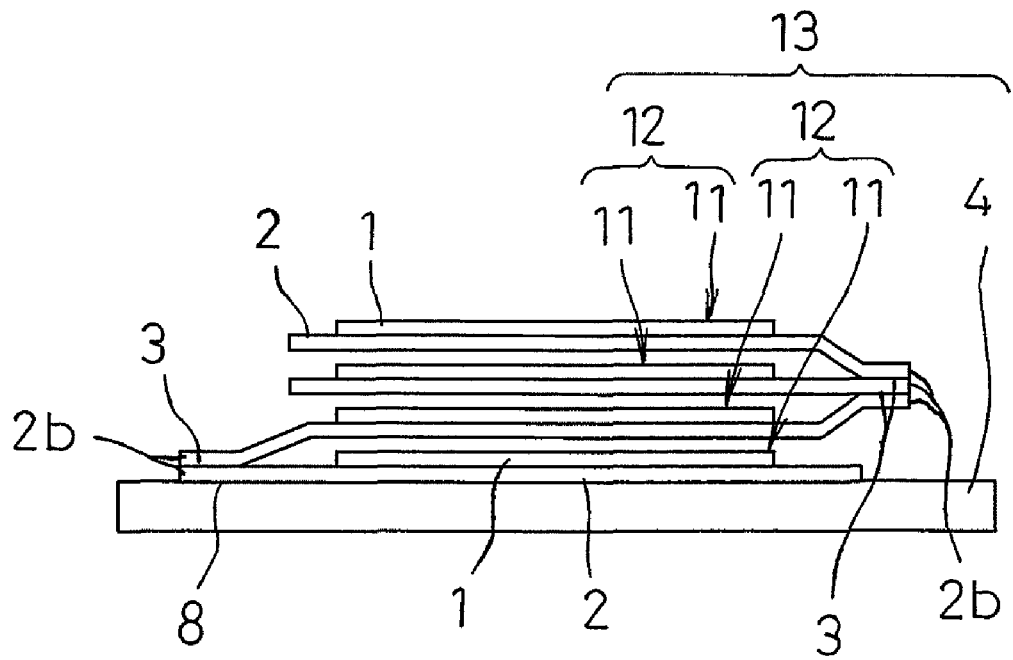
FIG. 4 is a side view of a mounted structure, showing yet another example of the bare chip according to the embodiment of the present invention.
Figure 5:
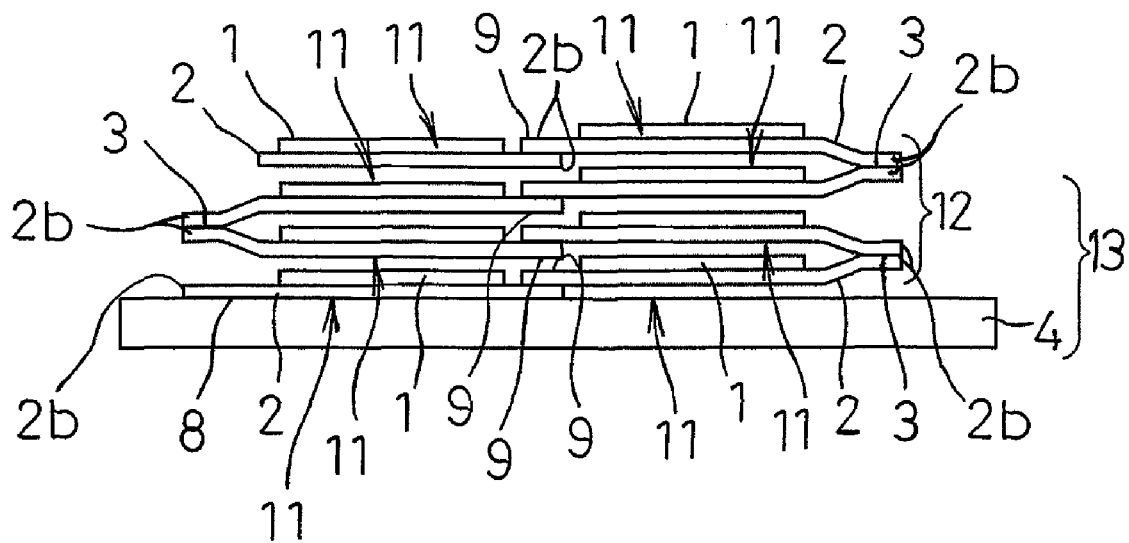
FIG. 5 is a side view of a mounted structure, showing yet another example of the bare chip according to the embodiment of the present invention.
Figure 6:
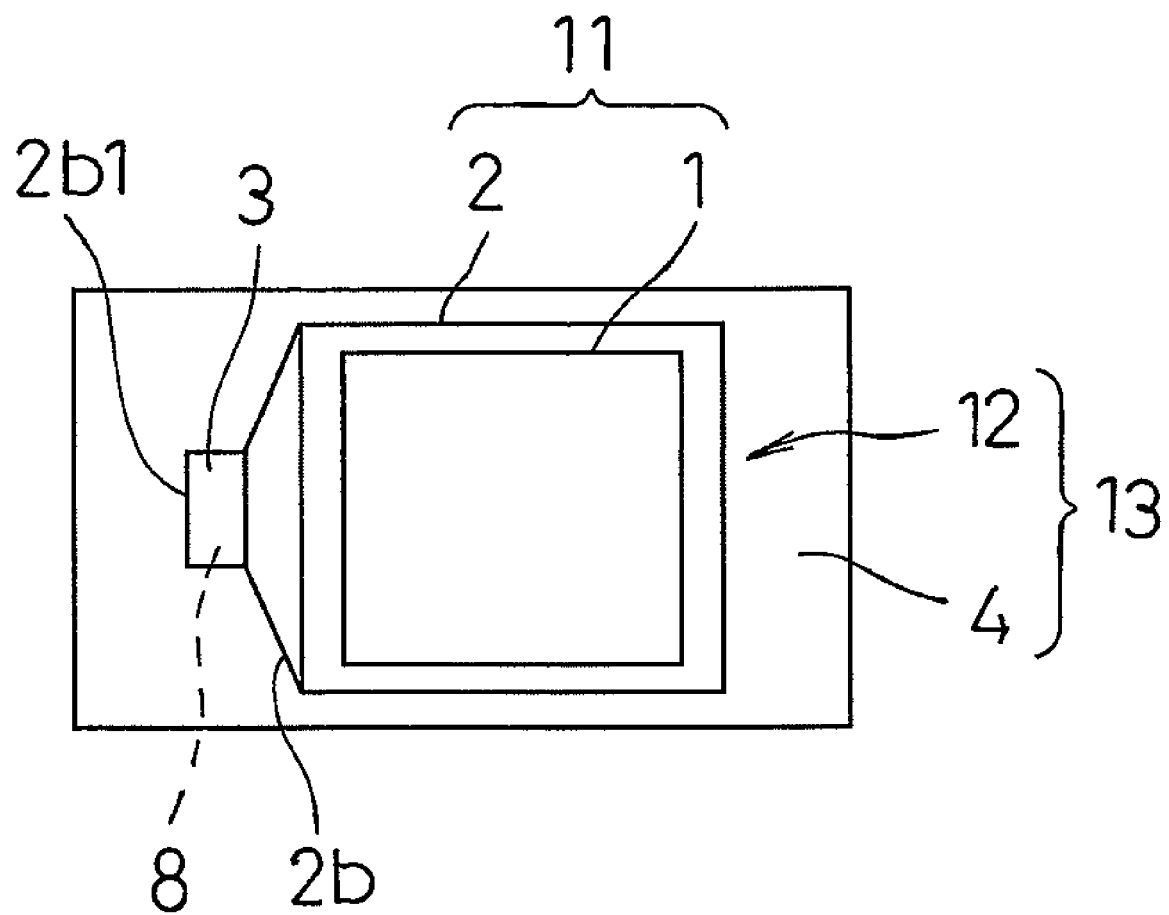
FIG. 6 is a plan view of a mounted structure, showing yet another example of the bare chip according to the embodiment of the present invention.
Figure 7A:
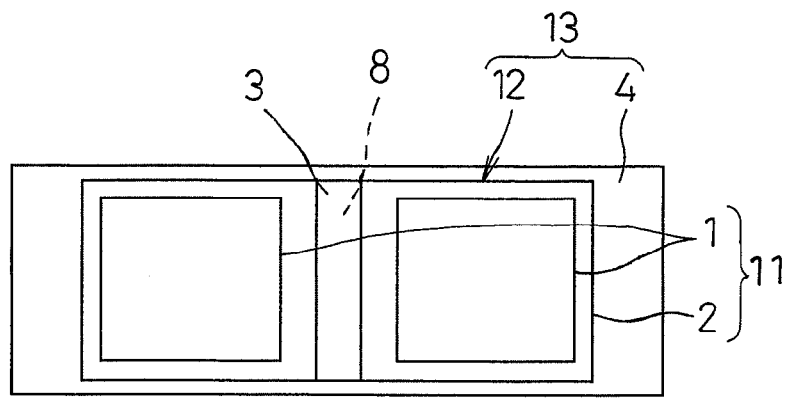
FIGS. 7A to 7C show yet another example of the bare chip according to the embodiment of the present invention, FIG. 7A being a plan view of a mounted structure, FIG. 7B being a side view of the same, FIG. 7C being an exploded perspective view of the same when accommodated in a case.
Figure 7B:
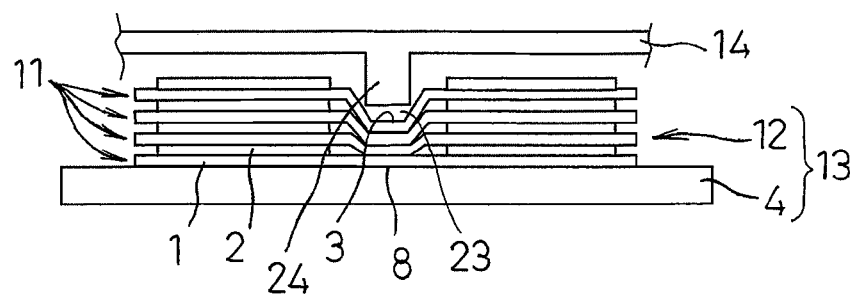
Figure 7C:
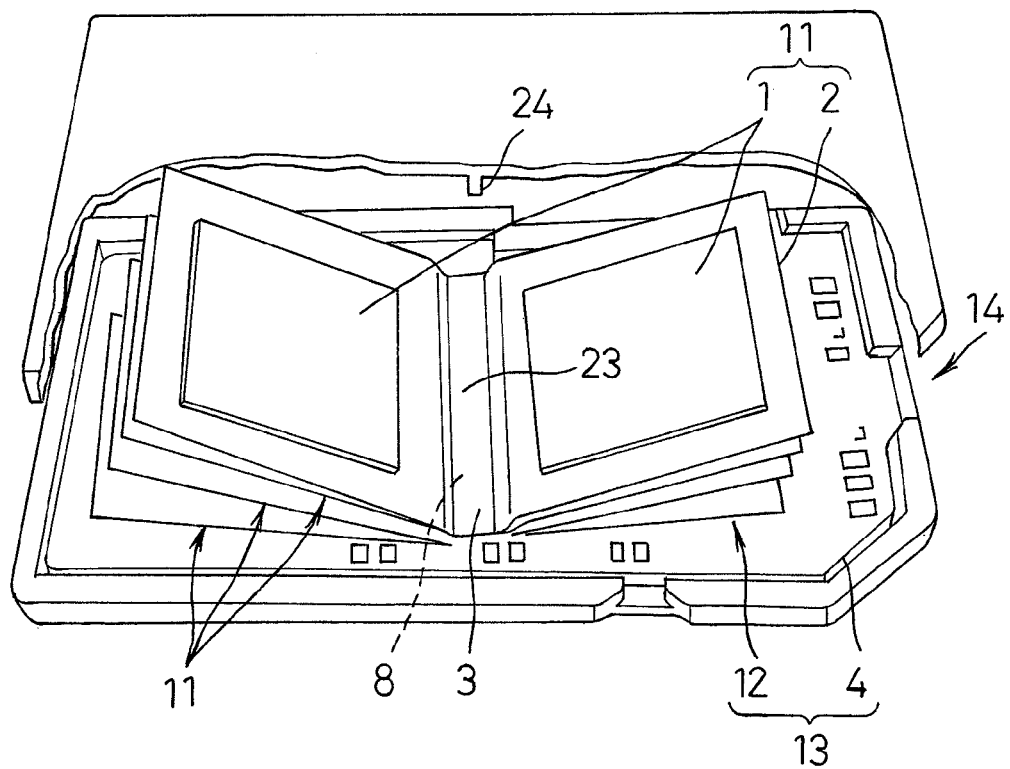
Figure 8A:
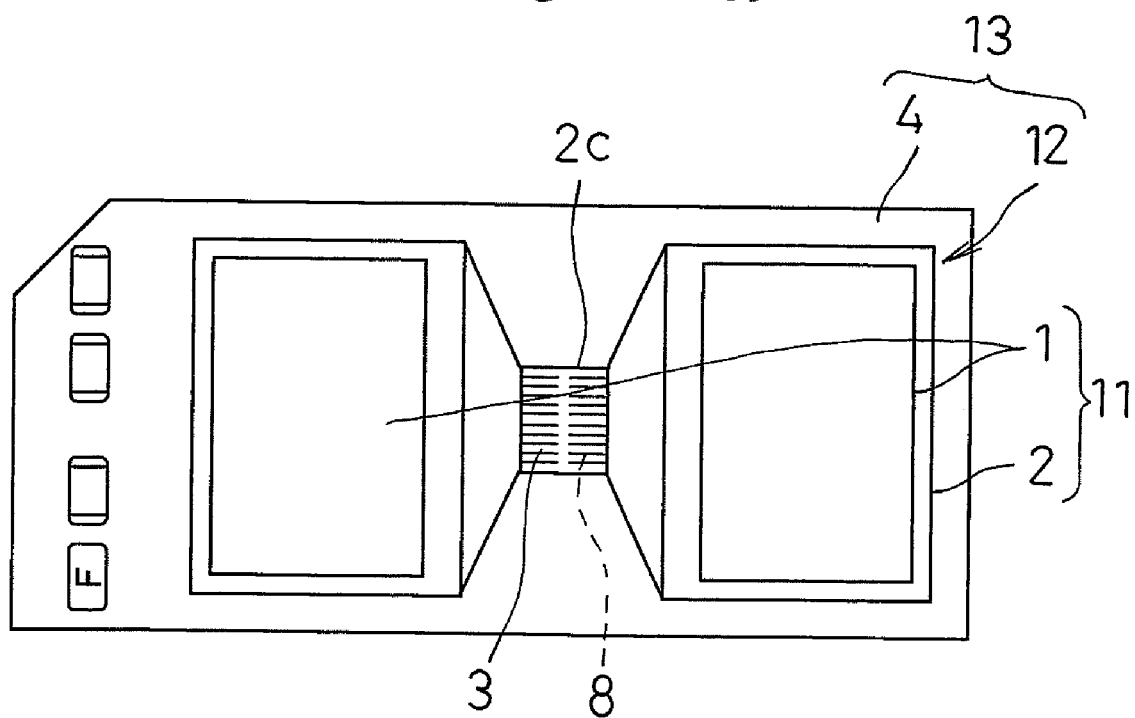
FIGS. 8A and 8B show yet another example of the bare chip according to the embodiment of the present invention, FIG. 8A being a plan view of a mounted structure, FIG. 8B being a side view of the same.
Figure 8B:
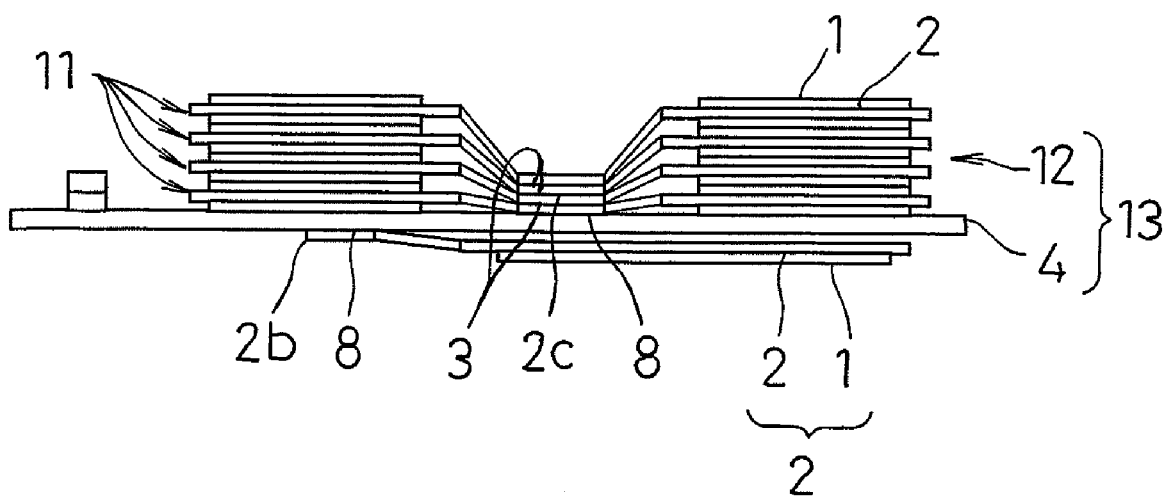
Figure 9:
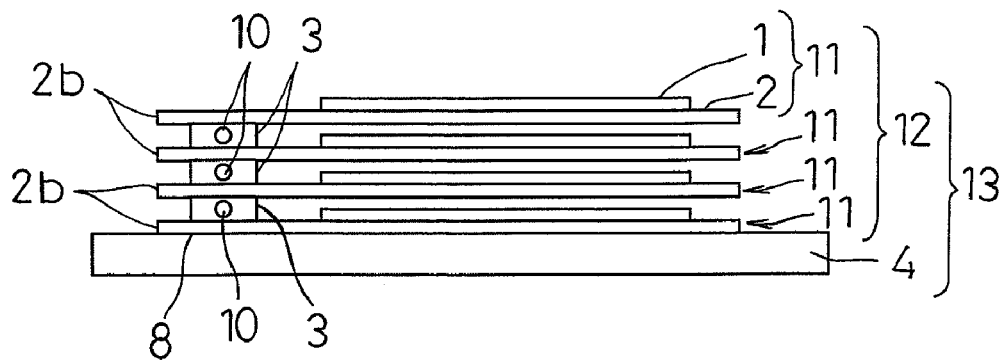
FIG. 9 is a side view of a mounted structure, showing a modification of the bare chip according to the embodiment of the present invention with respect to the example of FIG. 1.
Figure 10A:
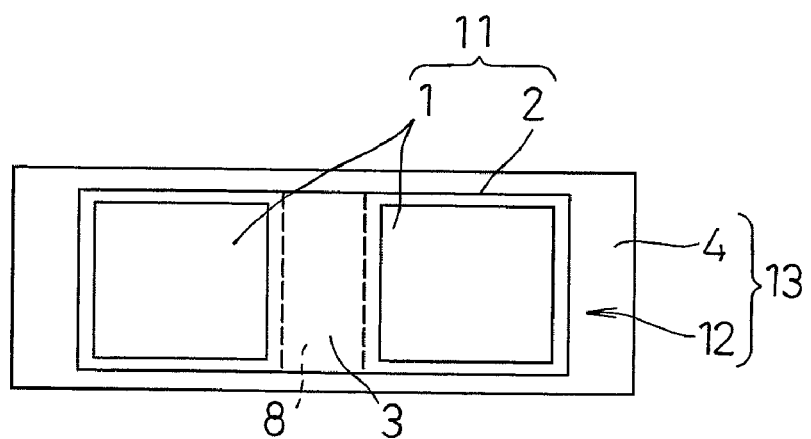
FIGS. 10A and 10B show a modification of the bare chip according to the embodiment of the present invention with respect to the example of FIGS. 7A to 7C, FIG. 10A being a plan view of the mounted structure, FIG. 10B being a side view of the same.
Figure 10B:
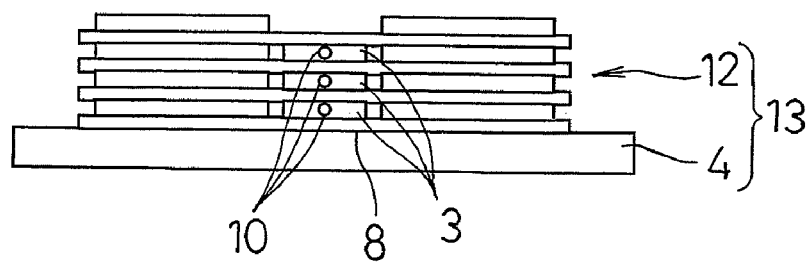

In the present embodiment, bare chips 1 mounted on film substrates 2 are mounted into a plurality of laminated states as in an example shown in FIGS. 1A and 1B, an example shown in FIG. 2, an example shown in FIG. 3, an example shown in FIG. 4, an example shown in FIG. 5, an example shown in FIG. 6, an example shown in FIGS. 7A to 7C, an example shown in FIGS. 8A and 8B, an example shown in FIG. 9, and an example shown in FIGS. 10A and 10B. The bare chips 1 may be semiconductor devices of any types such as an LSI. In terms of functional fields, they are not limited to memories, either, and are effectively applicable to ones having any circuit functions such as a microprocessor. The bare chips 1 may also be mounted on either one sides of the film substrates 2 for lamination as in each of the examples shown in FIGS. 1A to 7C, 9, and 10A and 10B, or may be mounted on both sides of the film substrates 2 for lamination as shown in FIGS. 8A and 8B. Although not shown in the drawings, film substrates 2 having bare chips 1 mounted on either one sides and film substrates 2 having bare chips 1 mounted on both sides may be combined into a laminated state, depending on situations.

When mounting bare chips 1 on film substrates 2 for lamination, the present embodiment, or throughout the examples shown in FIGS. 1A to 10B in particular, is basically characterized in that a plurality of film substrates 2 having bare chips 1 mounted thereon are joined into a laminated state at joint portions 3 and attached to a motherboard 4 at a location off the areas where their bare chips 1 are mounted on. This can easily be achieved by the steps of: mounting the bare chips 1 on either one side or both sides of the film substrates 2; joining the plurality of film substrate 2 having the bare chips 1 mounted thereon by such joint portions 3 as establish the laminated state at a location off the mounting areas of those bare chips 1; and attaching the film substrates 2 joined in the laminated state to the motherboard 4. The attachment of the film substrates 2 to the motherboard 4 is also effected by junction at a joint portion 8. Here, the bare chip mounting method according to the present embodiment successively fabricates: chip mounted modules 11 in which the bare chips 1 are mounted on either one or both sides of the film substrates 2; a laminated module 12 in which a plurality of chip mounted modules 11 are joined to each other at the joint portions 3 so that the bare chips 1 are in a laminated state; and an electronic circuit module 13 in which this laminated module 12 is attached to the motherboard 4 at the joint portion 8, thereby constituting various types of electronic circuits such as a memory. The final electronic circuit module 13 is accommodated in a case 14 which is made of synthetic resin or the like as shown exploded in FIG. 7C, thereby making an electronic circuit product of various forms such as card-type one.

For the purpose of such mounting, the bare chips 1, as typified by the top bare chip 1 in FIG. 1A, have electrodes 5 which are formed on their mounting surface 1a to be mounted on a film substrate 2, and are intended to establish electric connection and junction with not shown electric wiring on the film substrate 2. In the meantime, as typified by the film substrates 2 in FIG. 3 and the top film substrate 2 and the bottom film substrate 2 in FIG. 1A, each film substrate 2 has a single set of not-shown electric wiring and electrodes 6 necessary for establishing electric connection and junction to not-shown electric wiring of the motherboard 4 directly, or through other film substrates 2, in order to exercise predetermined functions. The motherboard 4, as typified in FIGS. 1A, 1B, and 3, is provided with not-shown electric circuits and electrodes 7 necessary for establishing electric connection and junction with the film substrates 2 in order to exercise predetermined functions. In some cases, the electrodes 7 of the motherboard 4 are formed to establish electric connection and junction with other electronic components, such as a bare chip 1, and electronic connectors. The respective junctions at the joint portions 3 between the electrodes 5 and 6, between the electrodes 6 and 6, and the electrodes 6 and 7 may be formed by using a variety of joint modes including solder joint, metal bumps, solder joint via metal balls 10 as shown in FIGS. 1A and 1B, and metal-to-metal joint for joining metals directly by utilizing heat, pressure, or the like caused by ultrasonic vibration or friction, aside from such methods pressure welding (ACF) using conductive particles. The electrodes 5 and 6, the electrodes 6 and 6, and the electrodes 6 and 7 joined are integrated in any case. The metal-to-metal joint can easily provide a high joint strength in particular. It should be appreciated that the solder joint using metal balls 10 can be performed by melting solder layers previously formed on the surfaces of the metal balls 10 and then solidifying the same. For the purpose of insulation from others, the electric wiring of the film substrates 2 is suitably built in. This can easily be achieved like by laminating films that carry a printed circuit or other wiring on either one or both of mating surfaces. It should be appreciated that the necessary electrodes 6 are exposed or protruded from the junction-side surfaces of the film substrates 2 for the purpose of establishing junction with the electrodes 5, 6, or 7 of the bare chips 1, the other film substrates 2, or the motherboard 4.

As above, a plurality of film substrates 2 having bare chips 1 mounted on either one side or both sides thereof are put into a laminated state by means of mutual junction, i.e., overlap junction in a mutually overlapped state without being folded back 180°. This makes the degree of bending extremely small as compared to the case with 180° folding, and makes both the films and wiring of the film substrates 2 accordingly freer from the issues of bending strength and distortion strength. Consequently, polyimide can be used for the films 2a as heretofore with improved durability. This increases the freedom of choice of wiring material in particular, allowing the use of, e.g., nickel instead of being limited to copper or the like. In general, it is possible to use film substrates 2 thinner than heretofore, such as around 25 μm or thinner. In addition, the joint portions between the electrodes 6 and 6 of the respective film substrates 2 are positioned outside the mounting areas where the film substrates 2 establish junction with the electrodes 5 of the bare chips 1. Thus, flexibility will not be impaired much around the bare chips 1 of the film substrates 2, i.e., around the mounting areas even if the joint portions 3 having higher rigidities to bending and distortion are formed continuously or discontinuously around the peripheries of the bare chips 1. As a result, the above-mentioned flexibility in the four continuous areas around the mounting areas of the bare chips 1 on the film substrates 2 prevents external forces from reaching the bare chips 1 through the film substrates 2 due to distortion or bending of the case 14. This provides the bare chips 1 with durability against fractures, cracking, and the like even with a thickness smaller than heretofore. For example, a current 4-MB bare chip 1 with an IC size of 14 mm×9 mm, having a thickness of around 90 μm, can be made as thin as or thinner than around 70 μm. To be more specific, a capacity comparable to a memory intended for a double-sided DVD of 9.4 GB requires eight to sixteen memory bare chips 1 that are commonly available at present. Suppose that a laminated module 12 is composed of chip mounted modules 11 in which two bare chips 1 are multi-mounted on both sides of the film substrates 2 as shown in the example of FIG. 6, the example of FIGS. 7A to 7C, and the example of FIG. 9. With the lower-profiling of the bare chips 1 and the film substrates 2 as described above, the laminated module 12 can be made as thin as approximately [70 µm×2 (two memory bare chips)+30 µm×2 (two bumps for joining memory bare chips+two film substrate electrodes)+25 µm (four film substrates)]×4=900 µm.

The lower-profiling of the film substrates 2 and the bare chips 1 as describe above leads directly to an even lower profile of the bare chip mounted structure, thereby achieving higher lamination and higher capacity with respect to a given thickness.

In another characteristic configuration of the present embodiment, a plurality of film substrates 2 having bare chips 1 mounted on either one side or both sides thereof are joined into a laminated state by the same joint portions 3 as described above and attached to the motherboard 4 on one sides 2b off the mounting areas of the bare chips as in the example shown in FIGS. 1A and 1B, the example shown in FIG. 2, the example shown in FIG. 6, and the example shown in FIG. 9. In this case, even if the joint portions 3 formed by joining the film substrates 2 have a higher rigidity to bending and distortion, those portions concentrate on the one sides 2b of the film substrates 2 to leave all the remaining three sides of the film substrates 2 free. This reduces restraint from the joint portions with the other film substrates 2 and the motherboard 4 accordingly, for even higher degrees of freedom. Consequently, it is easier to prevent external forces from reaching the bare chips 1 through the film substrates 2 due to distortion or bending of the case 14.

It should be appreciated that the laminated module 12 has a small number of electrodes if it is intended for a memory. The electrodes for establishing electric connection between the film substrates 2 may thus be accordingly small in number, and the joint portions 3 on the one sides 2b of the film substrates 2 have a sufficient space for junction. If there is still more room, the joint portions 3 where the film substrates 2 are joined to each other may be collected into even limited areas of the one sides 2b such as in the example shown in FIG. 6, or more particularly into parts 2b1 having a smaller area than the size of one side of the bare chips 1, and be joined to the motherboard 4 via a joint portion 8. In this case, the one sides 2b of the film substrates 2 other than the parts 2b1 become free, in comparison to the case where junctions are established by the joint portions 3 that cover almost the entire areas of the sides 2b. This increases the degrees of freedom of the film substrates 2, or more particularly the degrees of freedom to bending between the film substrates 2 that sandwich the joint portions 3 at their one sides 2b and by extension the degrees of freedom to distortion between the film substrates 2 in particular, so that it is even easier to prevent external forces from reaching the bare chips 1 through the film substrates 2 due to distortion or bending of the case 14. This is therefore best suited to making the bare chips 1 lower-profile. It should be appreciated that the joint portions between the parts of the one sides 2b of the film substrates 2 may be located in any position of the sides 2b, and may be collected to one corner or near a corner. The setting at the centers of the sides 2b is advantageous, however, because the degrees of freedom can easily be balanced between the right and left sides of the film substrates 2 for easy postural stabilization. On the other hand, if the laminated module 12 has no room to collect the joint portions 3 and 8 into one sides 2b of the film substrates 2 or parts 2b1 of them in view of the number of electrodes due to the laminated bare chip 1 including a microprocessor and the like, then the electrode-to-electrode junctions in the joint portions 3 and 8 may be configured in a plurality of arrays correspondingly.

Here, each of the examples will be described in detail. The example shown in FIGS. 1A and 1B shows a case where chip mounted modules 11 or film substrates 2 having a single bear chip 1 mounted thereon are joined by joint portions 3, with the opposed sides 2b of the film substrates 2 on the same side to each other, and are also joined to the motherboard 4 by a joint portion 8 on the same side. In this case, the junction points between the electrodes 6 and 6 in the joint portions 3 of the film substrates 2 are collected to the same one sides 2b of the film substrates 2, so that all the plurality of film substrates 2 to be laminated are in a uniform free state except the one sides that have the joint portions 3. This can prevent the film substrates 2 from varying in the degrees of freedom from each other and thus having different lives etc. It should be appreciated that the film substrate 2 immediately above the motherboard 4 can be electrically connected to the motherboard 4 directly through the junctions between the electrodes 6 and 7. The upper film substrates 2 establish electric connection between the motherboard 4 and electric wiring to be electrically connected with the bare chips 1 mounted thereon, through electrode-to-electrode junctions between the electrodes 6 an d 6 of theirs and the other lower film substrates 2 or/and between the electrodes 6 and 7 of the motherboard 4 and the film substrate 2 immediately thereon.

In other words, for the purpose of such electric connection and junction, each film substrate 2 has at least an upward-mounted electrode 6 for establishing electric connection between its own wiring and bare chip 1, and a downward self-connecting electrode 6 for establishing direct or indirect electric connection with the motherboard 4, as FIG. 1B schematically shows the state of junction when the wiring is simplified so that one signal line corresponds to one bare chip 1. Moreover, the intermediate film substrates 2 lying between the top film substrate 2 and the motherboard 4 also have a pair of mutually-shorted upward and downward relay electrodes 6 which relay electric connection between the self-connection electrode of the film substrate 2 immediately above the same and the motherboard 4. If each of the intermediate film substrates 2 has such pairs of relay electrodes 6 as many as the number of film substrates 2 lying above, it is possible to complete the electric connection necessary for between the top film substrate 2, each of the intermediate film substrates 2, and the motherboard 4. This makes it possible to deal with no matter how many chip mounted modules 11 the laminated module 12 comprises. It should be appreciated that a pair of upward and downward relay electrodes 6 need not be vertically opposed to each other, but may be shorted by short wiring if in a vertically not-opposite arrangement. This increases the degrees of freedom of arrangement.

In the example shown in FIG. 2, two laminated modules 12 having two film substrates 2 joined at one sides 2b to each other by a joint portion 3 are fabricated. These laminated modules 12 are combined into a laminated state such that their chip mounted modules 11 intervene each other in mutually-opposite sideways V-shaped positions with the one sides 2b outward, and the sides 2b are joined and attached to the motherboard 4 at respective joint portions 8. In the case of the present embodiment, each laminated module 12 to be attached to the motherboard 4 has a smaller number of film substrates to be joined by joint portions 3, and thus requires a smaller number of pairs of rely electrodes. That is, as compared to the example of FIGS. 1A and 1B, the number of pairs of relay electrodes required with respect to the number of chip mounted modules 11 laminated decreases by half. Specifically, the number of chip mounted modules 11 laminated is two each, and thus each of the laminated modules 12 requires only a single pair of relay electrodes on the lower chip mounted module 11, i.e., the one close to the motherboard 4. In other respects, there is no particular difference from the example shown in FIGS. 1A and 1B. Even in this case, the number of chip mounted modules 11 for constituting each laminated module 12 may be increased freely. The numbers of chip mounted modules 11 constituting the respective laminated modules 12 need not be identical to each other. Moreover, different numbers of bare chips 1 may be mounted. Between the two laminated modules 12 shown in the diagram, one or two of the laminated modules 12 opposed in opposite sideways V-shaped positions may be arranged in orthogonal directions in respective laminated states, and attached to the motherboard 4 under the same joint conditions so as to increase the numbers of lamination. It should be appreciated that the order of lamination of the chip mounted modules 11 in each laminated module 12 may be set freely.

In the example shown in FIG. 3, a laminated module 12 is formed by putting four chip mounted modules 11 into a laminated state, and overlapping and joining one sides 2b of their film substrates 2 to each other so that the joint portions 3 between the sides 2b come in opposite directions alternately in a zigzag fashion. The bottom film substrate 2 is joined to the motherboard 4 via the joint portion 8 at one side 2b opposite from the side 2b that is joined to the upper film substrate 2. This reduces the numbers of substrates overlapped at the respective joint portions 3 between the four laminated film substrates 2 to two each, advantageously suppressing the degrees of bending of the respective film substrates 2 corresponding to the amount of bare chips 1 laminated, ascribable to the junctions at the joint portions 3. Moreover, the top film substrate 2 is the same as the film substrates 2 in the example of FIGS. 1A and 1B and the example of FIG. 2 in having a joint portion 3 on one side 2b alone. In the meantime, the lower three of the four film substrates 2 excluding the top one have joint portions 3, or joint portions 3 and 8, on two opposite sides 2b. The laminated module 12 in which the individual film substrates 2 are joined at the joint portions 3 in a zigzag fashion, however, is supported in a floating state with the joint portion 8 of the bottom film substrate 2 to the motherboard 4 as a base point. This increases the degrees of freedom with respect to the motherboard 4 from the side of the motherboard 4 to the top film substrate 2 in succession, and the joint portions 3 on both sides will not function to transmit distortion or bending of the case 14 to the bare chips 1. In contrast, even if distortion or bending of the case 14 causes distortion or bending deformation on the joint portion 8 in a corresponding direction and thereby affects the bottom film substrate 2, the joint portion 3 on one side can follow freely though the bottom film substrate 2 tends to cause distortion between the joint portions 8 and 3 on both sides 2b. This makes it easier to prevent the bottom film substrate 2 from causing distortion or bending deformation between the joint portions 8 and 3 and thereby affecting the bare chips 1. Such an operation increases the degrees of freedom subsequently toward the top film substrate 2, based on which the individual joint portions 3 function not to cause bending or distortion on the film substrates 2 concerned, with a further improvement to the safety of the bare chips 1. It should be appreciated that in the present example, the zigzag joint between the film substrates 2 makes the numbers of relay electrodes 6 in the respective joint portions 3 and 8 increase from the top film substrate 2 to the bottom film substrate 2.

The example shown in FIG. 4 corresponds to a modification of the example of FIG. 2. That is, the two laminated modules 12 in sideways V-shaped positions in the example shown in FIG. 2 are stacked in the same directions, and the bottom laminated module 12 is joined to the motherboard 4 at a joint portion 8 which is formed on the side of its joint portion 3. The free side 2b of the upper film substrate 2 of the bottom laminated module 12 is joined to the same side as the joint portion 3 of the top laminated module 12 with a joint portion 3. This makes it possible to suppress the degrees of bending corresponding to the amount of bare chips 1 mounted, ascribable to the junctions of the respective film substrates 2 as in the example shown in FIG. 3, smaller while collecting the joints between the three film substrates 2 into the one side 2b so that the joint portion 3 with the other film substrate 2 is collected to the side of the joint portion 8 to the motherboard 4. It should be appreciated that the bottom film substrate 2 may be configured so that the joint portion 8 to the motherboard 4 is formed on the side opposite from the joint portion to the film substrate 2 immediately above. This provides the upper film substrates 2 with the degrees of freedom of the bottom substrate 2 at the free-end side. In the present example, the degrees of bending of the film substrates 2 ascribable to the joint portions 3 can be reduced to improve the safety of the film substrates 2 accordingly, thereby contributing to an even lower profile.

The example shown in FIG. 5, in terms of a mounting mode, corresponds to a modification of the zigzag joint method shown in FIG. 3. For each of the film substrate layers to be joined at joint portions 3 in a zigzag fashion, chip mounted modules 11 having a single bare chip 1 mounted on a film substrate 2 are joined to each other by a joint portion 9 so that opposed one sides 2b of the film substrates 2 overlap each other. This makes it possible to laminate and mount bare chips 1 twice as many as in the example of FIG. 3, though the junction points, or the joint portions 3 and 9 of the diagram, are large in number. Since the large number of junction points, or joint portions 3 and 9, are all in a floating state, distortion or bending of the case 14 will not affect the joint portions 3 to lower the durability of the bare chips 1.

In the example shown in FIG. 6, as mentioned previously, the joint portions 3 between the film substrates 2 of the example shown in FIGS. 1A and 1B, even including the junction to the motherboard 4 at the joint portion 8, are collected to parts 2b1 of the one sides 2b thereof, or center parts 2b1 in particular. Such a joint structure can also be similarly applied to the joint portions 3 and 8 in the examples shown in FIGS. 2 to 5.

In the example shown in FIGS. 7A to 7C, two bare chips 1 are mounted on a single film substrate 2 in a laterally axisymmetric arrangement as shown in FIG. 7A. Four chip mounted modules 11 each having this pair of bare chips 1 mounted thereon are put into a laminated state as shown in FIG. 7B. Those chip mounted modules 11 are joined into a laminated state at joint portions 3 on the axis of symmetry between the mounting areas of their bare chips, and joined and attached to the motherboard 4 at a joint portion 8. Consequently, according to the laminated module 12 in which the film substrates 2 having two bare chips 1 mounted thereon are laminated by the junction at the joint portions 3, the number of junction points of the film substrates 2, i.e., joint portions 3 with respect to the number of bare chips 1 laminated can be reduced to one out of the number of bare chips multi-mounted. Specifically, when the number of bare chips 1 mounted is the same as in the example of FIG. 5, or eight, then the total number of joint portions 3 is four which is reduced by half that of the case of FIG. 5.

In the present example, the junction by the joint portions 3 on the axis of symmetry of the bare chips 1 is effected to form a recess 23 in the film substrates 2 from a side opposite the motherboard 4 as shown in FIG. 7B. This recess 23 makes a receptacle for a reinforcing rib 24 formed on an inner surface of the case 14 which accommodates the motherboard 4 accompanied with the film substrates as shown in FIG. 7C. Consequently, the recess 23 which is formed by joining at the joint portions 3 the film substrates 2 of the plurality of chip mounted modules 11 having the bare chips 1 mounted in an axisymmetric arrangement can be utilized to locate the reinforcing rib 24 which is formed on the inner surface of the case 14. It is therefore possible to provide reinforcement over the center area which tends to lack in strength, with no particular increase in the thickness of the case 14. Such a recess 23 is fixed by joining the laminated module 12 to the motherboard 4 at the joint portion 8 on the axis of symmetry.

In the example shown in FIGS. 8A and 8B, the junctions between the film substrates 2 and between the film substrate 2 and the motherboard 4 by the joint portions 3 and 8 in the example shown in FIGS. 7A to 7C are realized in width-narrowed narrow width portions 2c of the film substrates 2. Despite the configuration of mounting a large number of bare chips 1, the degrees of freedom can thus be maximized in both areas across the joint portions 3 and 8, which fall between the mounting positions of the bare chips 1 on each film substrate 2, as with the case where the joint portions 3 and 8 are collected into parts 2b1 of the one sides 2b of the film substrates 2. Such a mounting mode can also be achieved, in the example shown in FIG. 5, by joining the joint portions 9 of the film substrates 2 in the respective layers to each other by joint points 3 for lamination, and joining the same to the motherboard 4 at the joint portion 8. This doubles the number of substrates laminated at the joint portions 3 and 9, whereas the necessary junction points are collected to one central position even in the example shown in FIG. 5.

The example shown in FIG. 9 and the example shown in FIGS. 10A and 10B correspond to modifications of the example of FIGS. 1A and 1B, the example of FIGS. 7A to 7C, and the like. The joint portions 3 between the film substrates 2, i.e., between the chip mounted modules 11 are configured to function also as spacers between the film substrates 2 or between the chip mounted modules 11. For that purpose, the present examples use metal balls 10 for the joint portions 3, so as to utilize the metal balls 10 coming into contact with the electrodes 5 and 6 of the bare chips 1 and the film substrates 2 when solder on the surfaces of the metal balls 10 is once melted and then solidified. The diameter of the metal balls 10 directly creates the joint spacing between the electrodes 5 and 6. Consequently, in the process of solder joint with metal balls 10 and the like, spacer-sized metal balls 10 can be selected and used to form a mounted structure in which the chip mounted modules 11 joined by the joint portions 3 have some room for clearances that avoid contact between the bare chips 1 without bending the film substrates 2. Then, if insulating layers are formed in these clearances for the purpose of insulation, the film substrates 2 can be insulated as simply shaped straight. Since the film substrates 2 undergo no bending, their durability improves accordingly with an even lower profile. Such a spacer function can also be provided by the height of bumps if employed instead of the metal balls 10. Specific means thereof is not limited in particular.

Figure 11A:
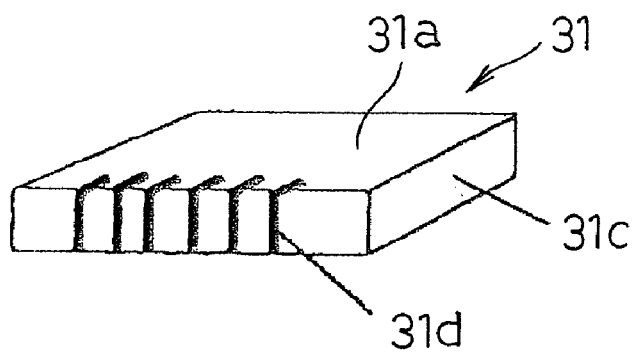
FIGS. 11A to 11C show a modification of the bare chip according to the embodiment of the present invention with respect to the examples of FIG. 9 and FIGS. 10A and 10B, FIG. 11A being a sectional view of a mounted structure using a substrate-to-substrate connector, FIG. 11B being a side view of the same, FIG. 11C being a perspective view showing a modification of the substrate-to-substrate connector as typified by a header.
Figure 11B:
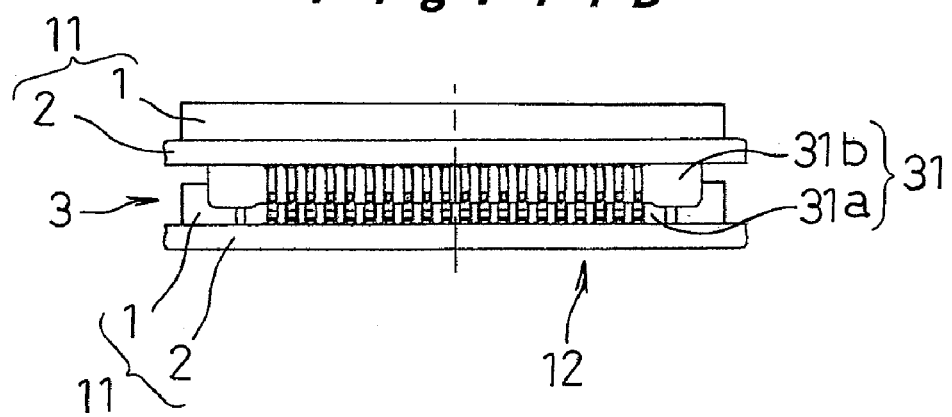
Figure 11C:
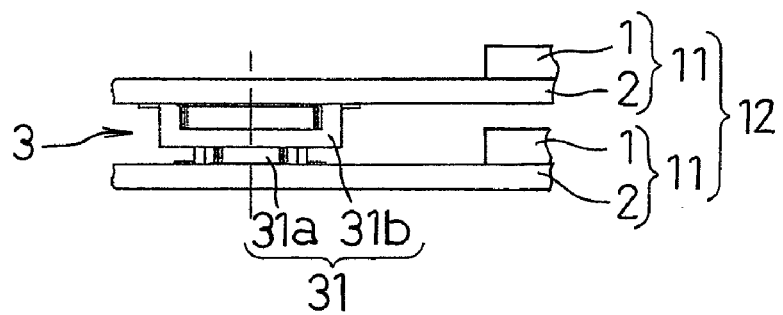

Now, the joint portions 3 that make the inseparable structures between the chip mounted modules 11 in the example shown in FIG. 9 and the example shown in FIGS. 10A and 10B, i.e., between the film substrates 2 of the same may be replaced with joint portions 3 that use a detachable substrate-to-substrate connector 31 for recyclability as in the example shown in FIG. 11A. This substrate-to-substrate connector 31 is composed of a header 31a and a receptacle 31b. After the header 31a and the receptacle 31b are joined to respective intended film substrates 2 by solder-based or other joint portions 33, they are opposed to and fitted to each other for electric connection. This can join the film substrates 2, i.e., the chip mounted modules 11 to each other with the detachable joint portion 3. Among known examples of such a substrate-to-substrate connector 31 are ones from Hirose Electric Co., Ltd. (URL:http://www.hirose.co.jp). Although the current models for general sales have sizes of, e.g., around 0.9 mm, they can be miniaturized. For that purpose, as typified by the header 31a in FIG. 11B, the current models of spring contact structure may be replaced with one in which lead wires 31d are embedded in the external surface of the joint area of a resin mold 31c. This can suppress voluminous configuration, being advantageous for downsizing and lower profiling.

When the electronic circuit module 13 having the foregoing laminated module 12 attached to the motherboard 4 is loaded into the case 14 as shown in FIGS. 7A to 7C, a cushioning material may be sealed in. If there is any room for small clearances between the units of lamination of the film substrates 2 having the bare chips 1 mounted thereon, i.e., between the chip mounted modules 11 and between the chip mounted module 11 and the motherboard 4, then the sealed cushioning material can penetrate in. This makes it possible to relieve mutual contact, and even provide insulation depending on the cushioning material. Such a cushioning material may be a gel such as grease, or a liquid of lower viscosity. The lower the viscosity, the easier it is to penetrate into the clearances and to cope with small clearances.

INDUSTRIAL APPLICABILITY

As has been described, according to the present invention, a plurality of film substrates having bare chips mounted thereon can be laminated without folding, thereby achieving films and wiring of lower profile. This allows applications to general electronic products where bare chips are mounted and used in a laminated state, contributing to a lower profile, higher lamination, and higher capacity.

The invention claimed is:

1. A bare chip mounted structure, comprising: a plurality of film substrates having bare chips mounted on one side or both sides in an axisymmetric arrangement, the film substrates being joined into a laminated state and attached to a motherboard on an axis of symmetry between areas where their bare chips are mounted,
    wherein the junction on the axis of symmetry is effected to form a recess in the film substrates from the counter side of the motherboard, the recess providing a receptacle for a reinforcing rib provided on an inner surface of a case which accommodates the motherboard accompanied by the film substrates.

2. The bare chip mounted structure according to claim 1, wherein joint portions of the film substrates also function as a spacer between the film substrates.

3. The bare chip mounted structure according to claim 1, wherein the motherboard to which the film substrates joined in a laminated state is attached is built into the case, and a cushioning material is sealed therein.

4. A bare chip mounting method comprising;
    mounting a plurality of bare chips on either one side or both sides of film substrates in a symmetric arrangement;
    joining the plurality of film substrates having the bare chips mounted thereon into a laminated state at the position of a symmetric border between areas where the bare chips are mounted; and
    attaching the film substrates joined in the laminated state to a motherboard, wherein the junction on the symmetric border is effected to form a recess in the film substrates from the counter side of the motherboard, the recess providing a receptacle for a reinforcing rib provided on an inner surface of a case which accommodates the motherboard accompanied by the film substrates.

5. The bare chip mounted method according to claim 4, wherein joint portions of the film substrates also function as a spacer between the film substrates.

* * * * *